(12) United States Patent
Haupt et al.

(10) Patent No.: US 6,645,839 B2
(45) Date of Patent: Nov. 11, 2003

(54) METHOD FOR IMPROVING A DOPING PROFILE FOR GAS PHASE DOPING

(75) Inventors: Moritz Haupt, München (DE); Anja Morgenschweis, Dresden (DE); Dietmar Ottenwälder, Dresden (DE); Uwe Schröder, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/139,165

(22) Filed: May 6, 2002

(65) Prior Publication Data

US 2003/0013283 A1 Jan. 16, 2003

(51) Int. Cl.[7] .............................................. H01L 21/38
(52) U.S. Cl. .................... 438/542; 438/510; 438/775; 438/914; 438/923; 257/28; 257/221
(58) Field of Search ........................ 438/510, 542, 438/775, 914, 923; 257/28, 221

(56) References Cited

U.S. PATENT DOCUMENTS

| | | |
|---|---|---|
| 5,242,859 A | 9/1993 | Degelormo et al. |
| 5,324,684 A | 6/1994 | Kermani et al. |
| 5,945,704 A | 8/1999 | Schrems et al. |
| 6,197,653 B1 | 3/2001 | Khamankar et al. |
| 6,413,844 B1 * | 7/2002 | Beulens et al. .............. 438/565 |
| 6,489,207 B2 * | 12/2002 | Furukawa et al. .......... 438/301 |

OTHER PUBLICATIONS

Ransom, C. M. et al.: "Shallow $n^+$ Junctions in Silicon by Arsenic Gas–Phase Doping", J. Electrochem. Soc., vol. 141, No. 5, May 1994, pp. 1378–1381.

Kiyota, Y. et al.: "Role of Hydrogen During Rapid Vapor–Phase Doping Analyzed by X–Ray Photoelectron Spectroscopy and Fourier–Transform Infrared–Attenuated Total Reflection", J. Vac. Sci. Technol., A 16 (1), Jan./Feb. 1998, pp. 1–5.

* cited by examiner

Primary Examiner—Kamand Cuneo
Assistant Examiner—Lisa Kilday
(74) Attorney, Agent, or Firm—Laurence A. Greenberg; Werner H. Stemer; Ralph E. Locher

(57) ABSTRACT

A method for improving a doping profile using gas phase doping is described. In the method, silicon nitride and/or products of decomposition from a silicon nitride deposition are introduced in a process chamber before or during the actual gas phase doping. This allows the doping profile to be significantly improved.

11 Claims, 4 Drawing Sheets

METHOD FOR IMPROVING A DOPING PROFILE FOR GAS PHASE DOPING

BACKGROUND OF THE INVENTION

FIELD OF THE INVENTION

The present invention relates to a method for improving a doping profile for gas phase doping and, in particular, to a method for improving a doping profile for gas phase doping used to produce a trench capacitor in a semiconductor memory cell.

Particularly when producing trench capacitors in semiconductor memory cells for integrated circuits, such as memories with random memory access (RAM random access memory), dynamic memories (DRAM, dynamic random access memory), synchronous dynamic memories (SDRAM, synchronous DRAM), etc., the production of a "buried plate" requires doping profiles which have sufficiently high doping concentrations even at relatively great depth.

Normally, such doping was carried out in a lower region of the trench capacitor using "AsG deposition", structuring of the AsG layer and a subsequent high temperature step in order to diffuse out the arsenic into the substrate. This allowed the doping to be limited to the lower part of the trench capacitor, with relatively great penetration depths into the substrate being achievable. Such AsG deposition is costly, however, and impinges upon technical boundaries particularly for future technology shrinks, for example on account of poor edge coverage.

To produce such a buried plate (outer electrode of the trench capacitor), doping methods using gas phase doping have also been proposed, which allows an integration density to be advanced further in principle. However, a drawback of such a conventional method for carrying out gas phase doping is a low and unstable doping level, which results in a severe limitation to suitability for mass production.

SUMMARY OF THE INVENTION

It is accordingly an object of the invention to provide a method for improving a doping profile for gas phase doping which overcomes the above-mentioned disadvantages of the prior art methods of this general type.

With the foregoing and other objects in view there is provided, in accordance with the invention, a method for improving a doping profile. The method includes the steps of providing and preparing a semiconductor substrate; introducing in a process chamber silicon nitride and/or products of decomposition from a silicon nitride deposition; and carrying out a gas phase doping in the process chamber.

Particularly the introduction of silicon nitride and/or products of decomposition from a silicon nitride deposition in a process chamber allows a doping level to be stabilized for gas phase doping carried out at the same time or subsequently, which makes the process suitable for mass production. In particular, this results in very high doping levels at a great depth in a semiconductor substrate.

Preferably, a silicon nitride layer is deposited in the process chamber, which allows the doping process to be significantly improved for gas phase doping.

Alternatively, ammonium chloride crystals or small amounts of HCl and/or $NH_3$ can be introduced into the process chamber as products of decomposition from the silicon nitride deposition, which again allows the doping levels for gas phase doping to be significantly stabilized and makes them suitable for mass production.

Preferably, the gas phase doping is carried out in a low-pressure range, which allows the dopant concentration to be increased further and permits further reductions in the size of the technological structure. Specifically, the gas phase doping is carried out in a pressure range of 13.33 pascals to 133.3 kpascals and a temperature range of 800 to 1100° C.

To implement arsenic gas phase doping, $AsH_3$ in a carrier gas containing He/Ar can be used, for example. Such process gases are normally present anyway in a large number of standard processes and thus facilitate implementation of the method in standard processes.

Alternatively, the carrier gas used can also be $H_2$, the result of which is an improved surface roughness, particularly in the case of gas phase doping in the low-pressure range. Particularly when implementing further technology shrinks, such improved surface roughnesses for the substrate allow extensive compensation for the associated undesirable reduction in capacitance when producing trench capacitors, for example.

In accordance with an added mode of the invention, there is the step of carrying out the gas phase doping as an arsenic gas phase doping, a phosphorus gas phase doping or a boron gas phase doping.

In accordance with another mode of the invention, there is the step of using 0.1–5% $AsH_3$ in the carrier gas during the gas phase doping.

In accordance with a further mode of the invention, during the gas phase doping, a temperature range is 900° C. to 950° C., a pressure range is 0.133 to 13.3 kpascals, a gas flow range is 200 to 400 sccm of 0.5–1% of a doping gas in a carrier gas, and a diffusion time range is 30 to 120 minutes.

In accordance with a concomitant mode of the invention, there are the steps of forming a trench in the semiconductor substrate, and forming an insulating collar in an upper region of the trench.

Other features which are considered as characteristic for the invention are set forth in the appended claims.

Although the invention is illustrated and described herein as embodied in a method for improving a doping profile for gas phase doping, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
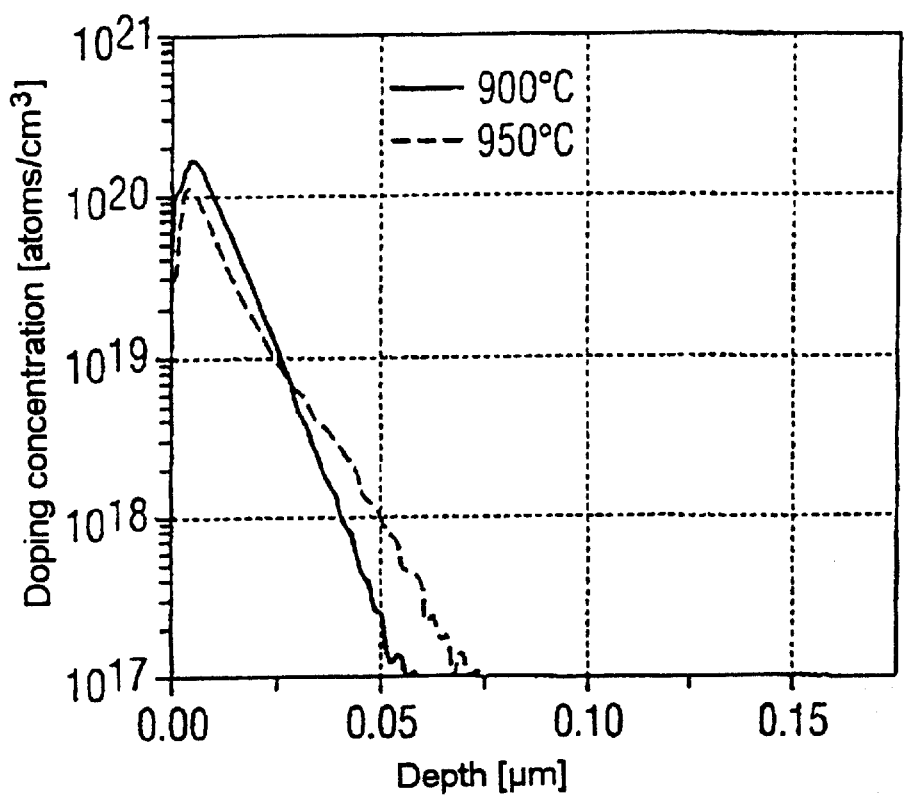
FIG. 1 is a graphical illustration of a doping concentration over a substrate depth for gas phase doping in accordance with the prior art.

Referring now to the figures of the drawing in detail and first, particularly, to FIG. 1 thereof, there is shown a graphical illustration of a dopant concentration over a substrate depth in a conventional method in order to illustrate the improvement in the doping profile in the inventive method.

FIG. 1 shows the doping profiles for conventional arsenic gas phase doping at two different temperatures (T=900° C. and T=950° C.). With the conventional gas phase doping, a more or less heavy dopant concentration in the depth of the semiconductor substrate is obtained as a function of the temperature, but with the dopant concentration being fundamentally greatly reduced as the depth increases. Particularly when producing semiconductor memory cells with trench capacitors, such doping profiles are inadequate, however, since they produce great fluctuations in the semiconductor component and are therefore not suitable for mass production.

Figure 2:
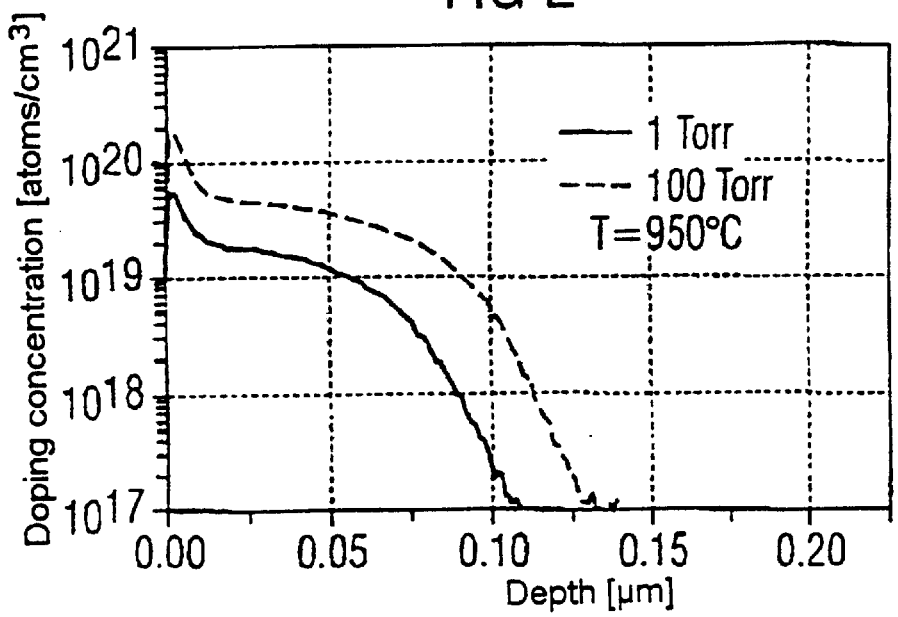
FIG. 2 is a graphical illustration of the dopant concentration over the substrate depth for the gas phase doping according to the invention.

In contrast, FIG. 2 now shows a graphical illustration of the dopant concentration over a substrate depth where the inventive gas phase doping has been carried out.

In FIG. 2, a process chamber, which is a low pressure chemical vapor deposition (LPCVD) reactor, for example, has been supplied with $NH_4Cl$ (ammonium chloride), for example in the form of crystals, before or during arsenic gas phase doping, and a significantly greater diffusion depth for the dopant (arsenic) and an associated significantly reduced layer resistance can be observed. For FIG. 2, the process temperature is T=950° C., with diffusion into the silicon substrate taking place over a period of 120 minutes.

Both in the case of gas phase doping using conventional pressures of approximately 13.3 kpascals (100 torr) and in the case of gas phase doping in a low-pressure range of approximately 133 pascals (1 torr), similar surface concentrations to those in FIG. 1 are obtained, but the depth of penetration of the dopants (As atoms) increases such that lower resistance values are obtained. Such an improved doping profile now allows improved suitability for mass production, particularly when producing a buried plate for trench capacitors for semiconductor memory elements.

Besides the supply of ammonium chloride crystals and small amounts of HCl and/or $NH_3$ to produce a significantly increased diffusion depth for dopants into the semiconductor material, a silicon nitride layer (SiN, $Si_3N_4$, etc.) can alternatively also be deposited in the process chamber, which results in preliminary conditioning with the same effect. Since such nitride processes are normally used anyway in almost all standard processes and, in particular, when forming trench capacitors in semiconductor memory cells, a combined process which significantly stabilizes a doping level and makes it suitable for inexpensive mass production is obtained without any additional involvement.

Improved process control is obtained particularly for arsenic gas phase doping (GPD) when the process parameters are as follows:

| | |
|---|---|
| temperature range | 900–950° C. |
| pressure range | 133.3–13333.3 pascals (1–100 torr) |
| gas flow | 200–400 sccm process gas |
| diffusion time | 30–120 minutes |
| carrier gas | $H_2$ or He and/or Ar |
| doping gas | 0.5–1% arsine in a carrier gas |

The best results, i.e. the highest dopant concentrations, are obtained at a pressure of approximately 13.3 kpascals (100 torr) at 950° C. and with a gas flow of 300 sccm $AsH_3$/carrier gas mixture and a diffusion time of 120 minutes.

Figure 3:
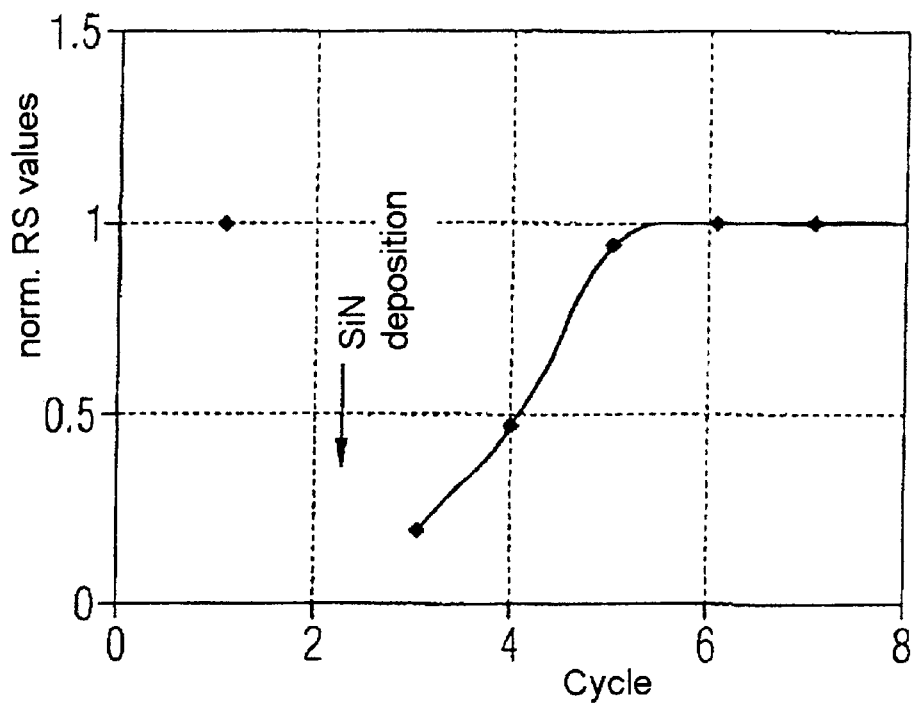
FIG. 3 is a graphical illustration of normalized layer resistance values over a multiplicity of process cycles in a process chamber and as a function of a SiN deposition.

FIG. 3 shows a graphical illustration of normalized layer resistance values (RS) for silicon test wafers over a multiplicity of process cycles or process passes in the process chamber or the LPCVD reactor. With no conditioning of the installation, i.e. without SiN deposition, the layer resistance (RS) of the doped substrates has been normalized to 1. After SiN has been deposited in the second process pass, the As doping in the substrate shown in FIG. 3 is increased significantly, which is reflected in a lowering of the RS values. After approximately four process passes or four process cycles, the original layer resistance value of 1 is reached again.

In the process control performed in FIG. 3, the process gas used was 0.7% arsine ($AsH_3$) in a carrier gas of $H_2$. In this context, it was discovered that, particularly in the case of gas phase doping in the low-pressure range in the presence of hydrogen, a significant increase in the surface roughness of the substrate arises, as a result of which, in particular, a semiconductor surface and hence also an increase in capacitance can be produced. A reduction in capacitance associated with future reductions in the size of technological structures (shrinks) can be compensated for at least in part in this way. The process conditions for such low-pressure gas phase doping are a temperature of 950° C., a pressure of 133.3 pascals (1 torr), a gas flow of 300 sccm $AsH_3$/carrier gas mixture and a diffusion time of 120 minutes. In this context, it was discovered that an increase in the process pressure also increases the surface roughness of the semiconductor it substrate (Si). Particularly with 0.7% arsine in $H_2$ and a pressure of 4 kpascals (30 torr), an increased surface roughness is obtained for otherwise identical process conditions.

Figure 4:
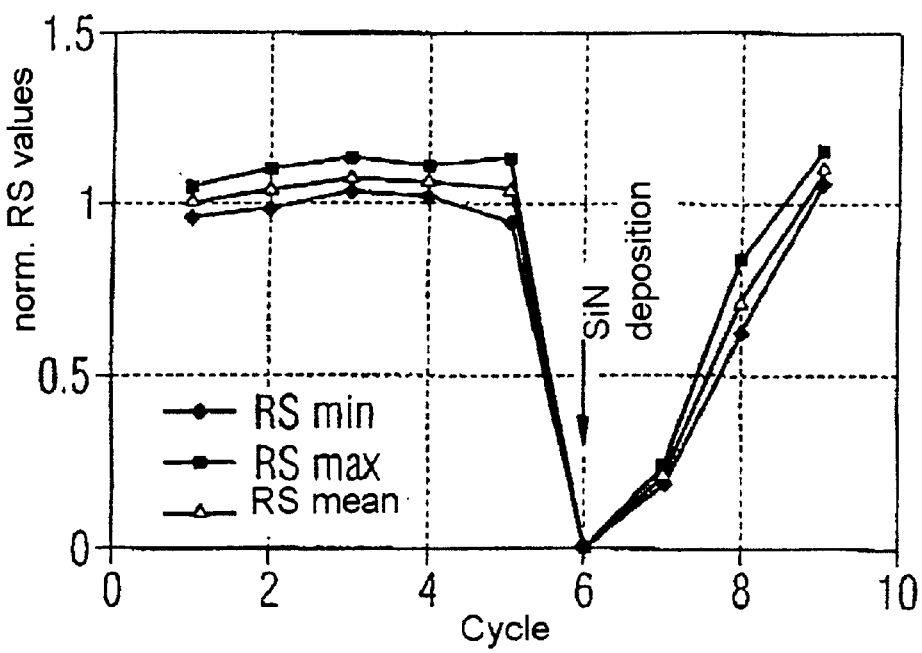
FIG. 4 is a graphical illustration of normalized layer resistance values over a multiplicity of process cycles in the process chamber and as a function of the SiN deposition in accordance with a second exemplary embodiment.

FIG. 4 shows another graphical illustration to illustrate the influence of the SiN deposition, with the layer resistance curve for a multiplicity of silicon test plates (wafers) again being shown before and after the SiN deposition. For FIG. 4, the process gas used in this context is 1% arsine in He/Ar.

Again, with no conditioning of the installation, the layer resistance value (RS) for the doped substrate is first normalized to 1, in which case an increased As doping in the substrate was discovered after SiN had been deposited in the process chamber. The increase is reflected in a reduction in the Rs value for the sixth process cycle or for the sixth process pass. Again, the original normalized layer resistance value of 1 is reached after approximately three process passes. In this context, the curves $RS_{min}$, $RS_{max}$ and $RS_{mean}$ denote minimum, maximum and mean layer resistance values for respective silicon test plates.

On the basis of FIG. 4, however, there is no increase in a surface roughness for the semiconductor substrate, since the carrier gas used is He/Ar. The process parameters for the gas phase doping carried out in FIG. 4 are a temperature of 950° C., a pressure of approximately 2 kpascals (15 torr), a gas flow of 200 sccm of $AsH_3$/carrier gas mixture and a diffusion time of 120 minutes when 1% arsine in He/Ar is used.

Hence, by depositing a silicon nitride layer in the process chamber and/or by introducing products of decomposition from silicon nitride deposition, such as $NH_4Cl$ or HCl and $NH_3$, it is possible to achieve a significantly increased diffusion depth for the dopant and, associated with this, a significantly lower layer resistance.

Figure 5:
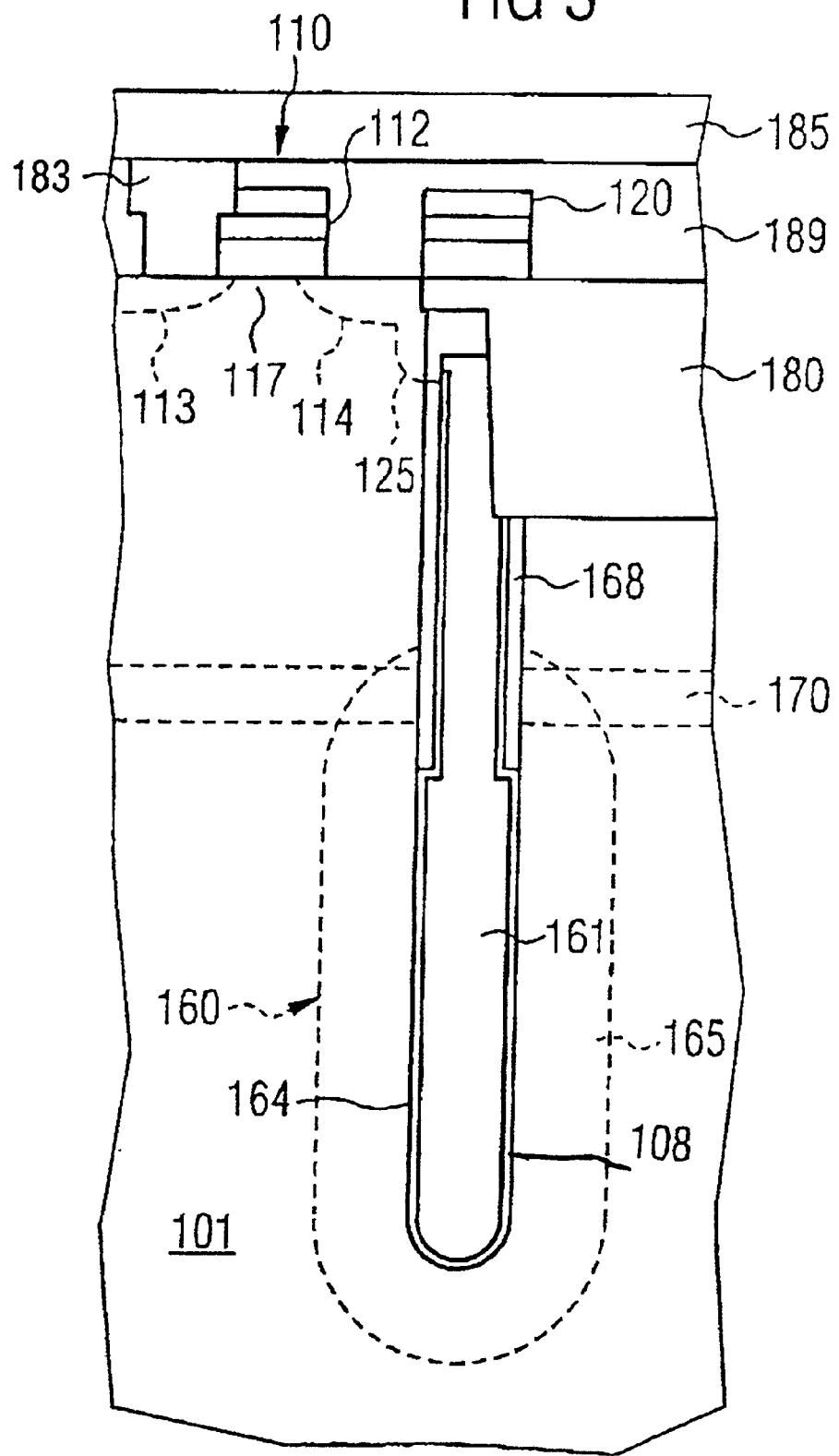
FIG. 5 is a diagrammatic, partial, simplified sectional view of a semiconductor memory cell with a trench capacitor, where a buried plate is formed with the inventive gas phase doping.

FIG. 5 shows a simplified sectional view of a semiconductor memory cell with a trench capacitor 160, where a buried plate 165 is formed using the method described above. In FIG. 5, the trench capacitor 160 is formed in a deep trench 108 that is formed in a semiconductor substrate 101 and has an insulating collar 168 on its upper region. In its lower region or section, the trench 108 has the buried plate 165 that acts as a first capacitor electrode and is isolated from a conductive filling material 161, acting as a second capacitor plate, by a dielectric layer 164. In this context, the buried plate 165 is formed by the gas phase doping described above and prior silicon nitride conditioning of the process chamber or supply of products of decomposition from the silicon nitride deposition.

The DRAM semiconductor memory cell shown in FIG. 5 also has a field effect transistor 110. The transistor has a gate 112 and diffusion regions 113 and 114. The diffusion regions, which are spaced apart from one another by a channel 117, are normally formed by implanting dopants, such as phosphorus. In this context, a contact diffusion region 125 connects the capacitor 160 to the transistor 110.

In FIG. 5, the semiconductor memory cell with the trench capacitor 160 also has a buried well or layer 170, with the peak concentration of the dopants in the buried n-well being approximately at a lower end of the insulating trench 168. The buried well or layer 170 is essentially used for electrically connecting the buried plates 165 of a multiplicity of adjacent DRAM semiconductor memory cells or capacitors 160 in the semiconductor substrate 101.

Activating the transistor 110 by applying a suitable voltage to the gate 112 essentially allows access to the trench capacitor 160, the gate 112 normally being connected to a word line 120, and the diffusion region 113 being connected to a bit line 185 in the DRAM array. In this context, the bit line 185 is isolated from the diffusion region 113 by a dielectric insulating layer 189 and is electrically connected by a contact 183.

In addition, to insulate a respective semiconductor memory cell with an associated trench capacitor from adjoining cells, a shallow trench isolation (STI) 180 is formed at a surface of the semiconductor substrate 101. In line with FIG. 3, by way of example, the word line 120 can be formed insulated by the shallow trench isolation (STI) 180 above the trench, the result of which is a "convoluted bit line architecture".

Figure 6:
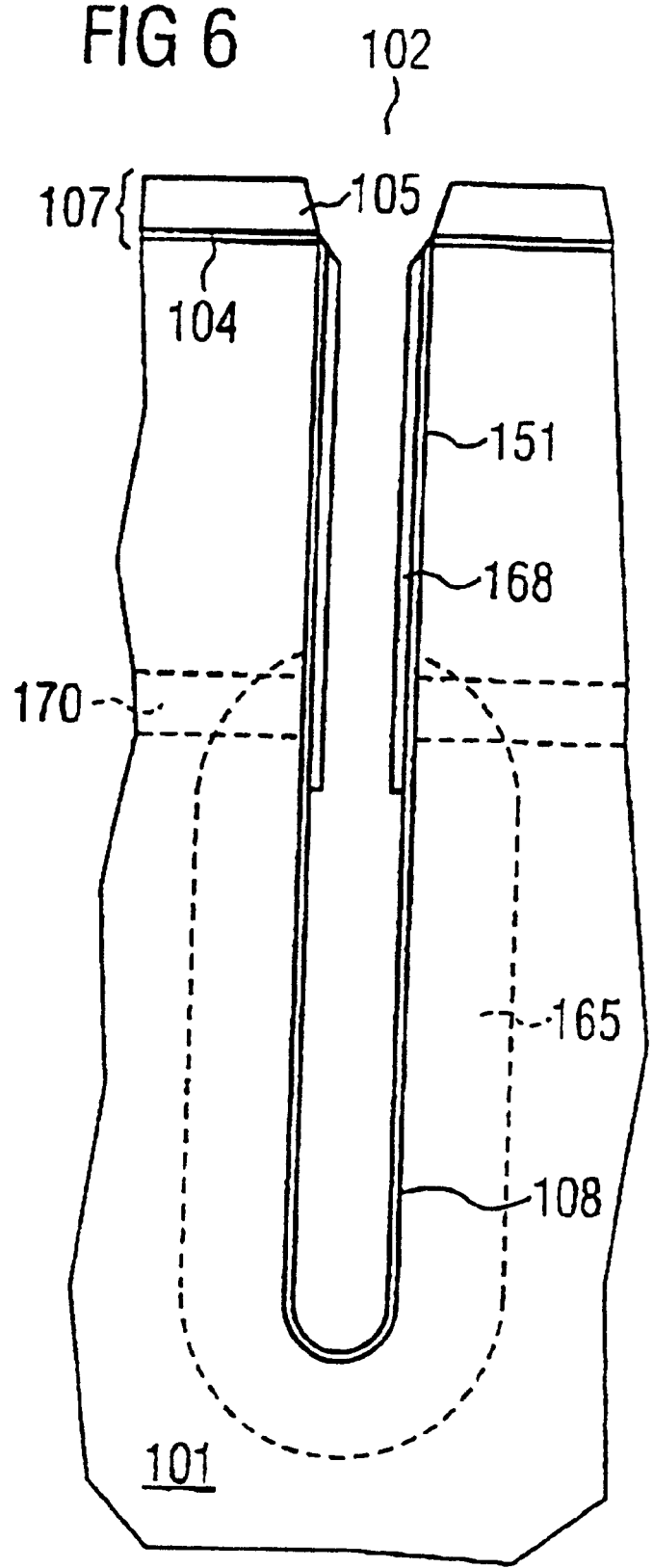
FIG. 6 is a partial, simplified sectional view to illustrate a fundamental method step for forming the buried plate for the trench capacitor shown in FIG. 5.

FIG. 6 shows a sectional view of the trench capacitor 160 shown in FIG. 5 to illustrate a fundamental method step when producing the improved doping profile for the buried plate 165. The same reference numerals denote the same or corresponding layers, which is why no repeat description is given below.

In FIG. 6, a non-illustrated polysilicon sacrificial layer is removed in the lower region of the trench 108. The polysilicon sacrificial layer is preferably removed by chemical dry etching (CDE). A thin natural oxide layer 151 is then typically present on the exposed side walls of the trench 108.

The thin natural oxide layer 151 can be sufficient to serve as a CDE etching stop. Once the polysilicon sacrificial layer has been removed, the buried plate 165 is now formed, preferably using n-dopants, such as As or P, as the second capacitor electrode.

In contrast to the conventional doping methods described in the introduction, on the basis of the present invention, a id process chamber is now conditioned with silicon nitride before or during the gas phase doping and/or products of decomposition from a silicon nitride deposition are introduced. In this context, the gas phase doping can be carried out in a low-pressure range of approximately 133.3 pascals (1 torr) or in a pressure range of approximately 13.3 kpascals (100 torr).

As an alternative to the $AsH_3$ described above, the doping gas used can also be $PH_3$, $B_2H_6$ or another doping gas. In the same way, as an alternative to the surface-improving $H_2$, the carrier gas used can also be He and/or Ar. In this way, the buried plate 165 can be formed so as to be self-aligning with respect to the insulating collar 168 and in direct dependence on the shape of the lower region of the trench 108 with a stable doping level, the result of which is increased suitability for mass production.

Since silicon nitride deposition is used anyway in such processes, the necessary conditioning of a respective process chamber can be implemented without additional involvement and merely with a small time deficit.

Particularly when using gas phase doping in the low-pressure range, no deformation whatsoever and no flow of the silicon structures arise, which is why sufficiently small structures can be used for future reductions in the size of the technological structure.

There is also a significant reduction in process costs on account of the considerable saving on $AsH_3$ and $PH_3$ or $B_2H_6$, since the necessary dopant profiles can now be produced with significantly less involvement.

The invention has been described above with reference to a method for forming the buried plate in the trench capacitor. It is not limited to this, however, and similarly covers all other methods for producing semiconductor structures in which an improved doping profile is to be formed using gas phase doping.

In the same way, the gas phase doping is not limited to arsenic, phosphorus or boron gas phase doping, but rather similarly covers all other gas phase doping processes for producing doping profiles in respective semiconductor substrates and structures. In the same way, the present invention is not limited to silicon semiconductor substrates, but rather similarly covers alternative semiconductor substrates.

We claim:

1. A method for improving a doping profile, which comprises the steps of:
   providing and preparing a semiconductor substrate;
   introducing in a process chamber at least one of silicon nitride and products of decomposition from a silicon nitride deposition; and
   carrying out a gas phase doping in the process chamber.

2. The method according to claim 1, which comprises depositing a silicon nitride layer in the process chamber during the introducing step.

3. The method according to claim 1, which comprises providing ammonium chloride crystals into the process chamber during the introducing step.

4. The method according to claim 1, which comprises providing amounts of at least one of HCl and $NH_3$ into the process chamber during the introducing step.

5. The method according to claim 1, which comprises carrying out the gas phase doping in a pressure range of 13.33 pascals to 133.3 kpascals and a temperature range of 800 to 1100° C.

6. The method according to claim 1, which comprises carrying out the gas phase doping as one of arsenic gas phase doping, phosphorus gas phase doping and boron gas phase doping.

7. The method according to claim 6, which comprises using at least one of He and Ar as a carrier gas.

8. The method according to claim 6, which comprises using $H_2$ as a carrier gas.

9. The method according claim 7, which comprises using 0.1–5% $AsH_3$ in the carrier gas during the gas phase doping.

10. The method according to claim 1, which comprises during the gas phase doping, setting a temperature range to be 900° C. to 950° C., a pressure range to be 0.133 to 13.3 kpascals, a gas flow range to be 200 to 400 sccm of 0.5–1% of a doping gas in a carrier gas, and a diffusion time range to be 30 to 120 minutes.

11. The method according to claim 1, which comprises:

forming a trench in the semiconductor substrate; and forming an insulating collar in an upper region of the trench.

* * * * *

UNITED STATES PATENT AND TRADEMARK OFFICE
CERTIFICATE OF CORRECTION

PATENT NO.    : 6,645,839 B2
DATED         : November 11, 2003
INVENTOR(S)   : Moritz Haupt et al.

It is certified that error appears in the above-identified patent and that said Letters Patent is hereby corrected as shown below:

<u>Title page,</u>
Item [30], should read as follows:
-- Foreign Application Priority Data
May 4, 2001 (DE) …….... 101 21 778.1 --

Signed and Sealed this

Ninth Day of March, 2004

JON W. DUDAS
*Acting Director of the United States Patent and Trademark Office*